United States Patent
Fujii et al.

(10) Patent No.: US 9,882,127 B2
(45) Date of Patent: Jan. 30, 2018

(54) NONVOLATILE RESISTANCE CHANGE ELEMENT

(71) Applicant: Toshiba Memory Corporation, Minato-ku (JP)

(72) Inventors: Shosuke Fujii, Fujisawa (JP); Hidenori Miyagawa, Yokohama (JP); Takashi Yamauchi, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 24 days.

(21) Appl. No.: 13/955,546

(22) Filed: Jul. 31, 2013

(65) Prior Publication Data

US 2013/0306932 A1 Nov. 21, 2013

Related U.S. Application Data

(63) Continuation of application No. PCT/JP2012/058275, filed on Mar. 19, 2012.

(30) Foreign Application Priority Data

Jun. 2, 2011 (JP) .................. 2011-124541

(51) Int. Cl.
H01L 45/00 (2006.01)

(52) U.S. Cl.
CPC ........ H01L 45/1253 (2013.01); H01L 45/085 (2013.01); H01L 45/12 (2013.01); H01L 45/148 (2013.01)

(58) Field of Classification Search
CPC ............ H01L 45/085; H01L 45/1253
(Continued)

(56) References Cited

U.S. PATENT DOCUMENTS 8,467,227 B1 * 6/2013 Jo .................. G11C 13/0007
365/148
8,716,098 B1 * 5/2014 Herner ................ H01L 45/085
257/324

(Continued)

FOREIGN PATENT DOCUMENTS

CN 101101964 A 1/2008
JP 2007-300100 11/2007
(Continued)

OTHER PUBLICATIONS

Combined Taiwanese Office Action and Search Report dated Mar. 25, 2014, in Taiwanese Patent Application No. 101109861 with English translation.

(Continued)

Primary Examiner — Moazzam Hossain
Assistant Examiner — Warren H Kilpatrick
(74) Attorney, Agent, or Firm — Oblon, McClelland, Maier & Neustadt, L.L.P.

(57) ABSTRACT

According to one embodiment, a nonvolatile resistance change element includes a first electrode, a second electrode, a semiconductor layer and a first layer. The first electrode includes at least one of Ag, Ni, Co, Al, Zn, Ti, and Cu. The semiconductor layer is sandwiched between the first and second electrodes. The first layer is provided between the second electrode and the semiconductor layer and contains an element included in the semiconductor layer and at least one of Ag, Ni, and Co.

23 Claims, 10 Drawing Sheets

(58) Field of Classification Search
USPC .......................................................... 257/4
See application file for complete search history.

(56) References Cited

U.S. PATENT DOCUMENTS

| | | | |
|---|---|---|---|
| 2008/0006907 A1 | 1/2008 | Lee et al. | |
| 2011/0305064 A1* | 12/2011 | Jo | G11C 13/0002 365/148 |
| 2012/0108030 A1* | 5/2012 | Herner | H01L 45/085 438/382 |

FOREIGN PATENT DOCUMENTS

| | | |
|---|---|---|
| JP | 2008-10836 | 1/2008 |
| JP | 2008-16854 | 1/2008 |
| JP | 2010-165950 | 7/2010 |
| JP | 2011-49455 | 3/2011 |

OTHER PUBLICATIONS

U.S. Appl. No. 14/022,732, filed Sep. 10, 2013, Ishikawa, et al.
International Search Report dated Jun. 12, 2012 in PCT/JP2012/058275 filed Mar. 19, 2012.

* cited by examiner

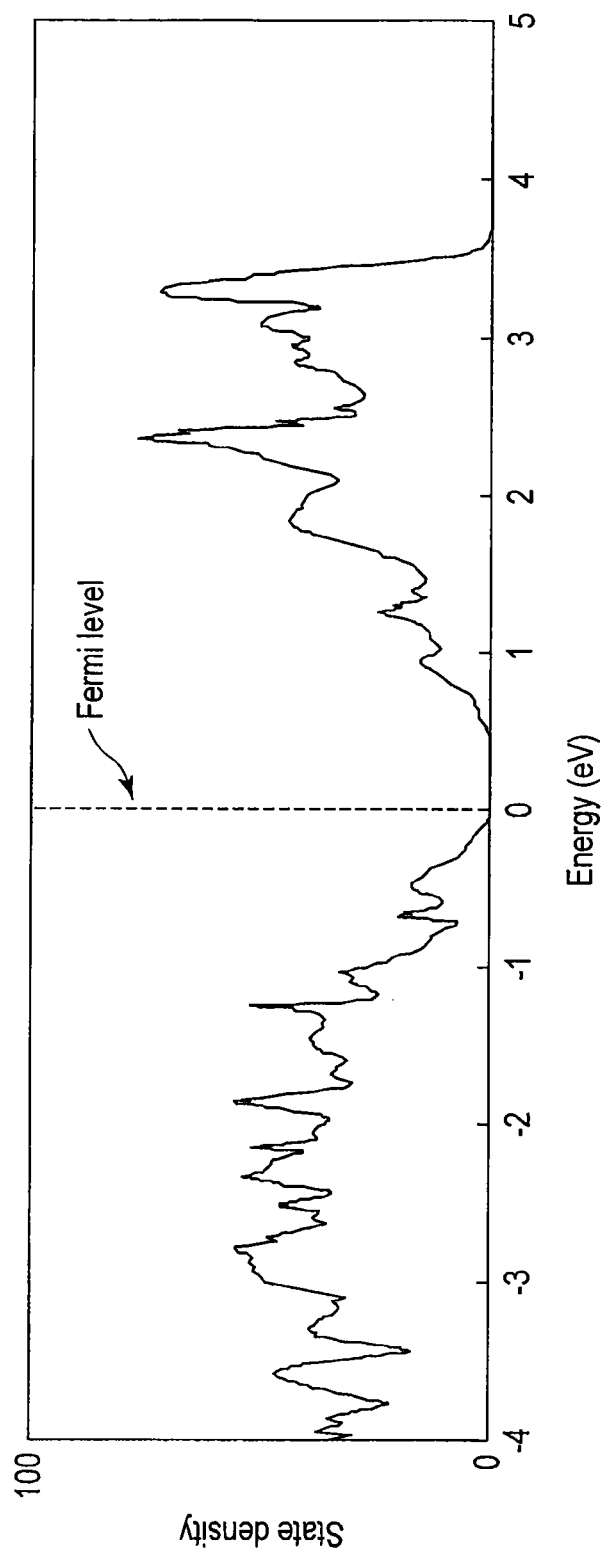
F I G. 3

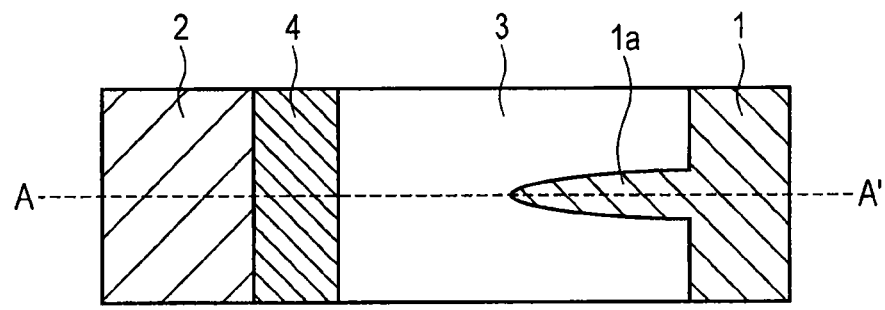
F I G. 4A
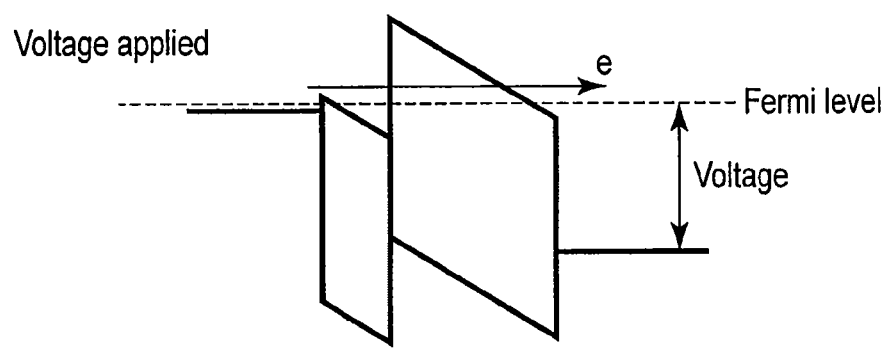
F I G. 4B

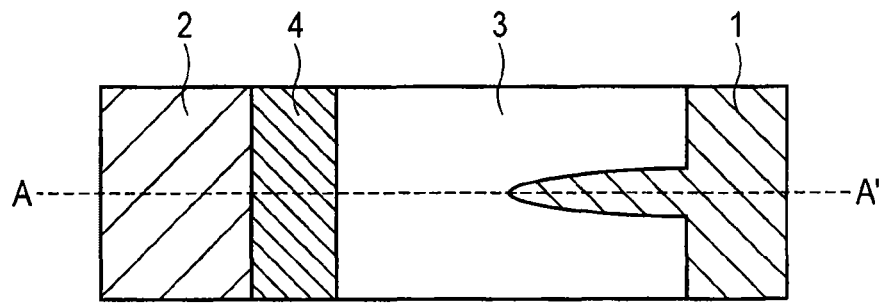
F I G. 5A
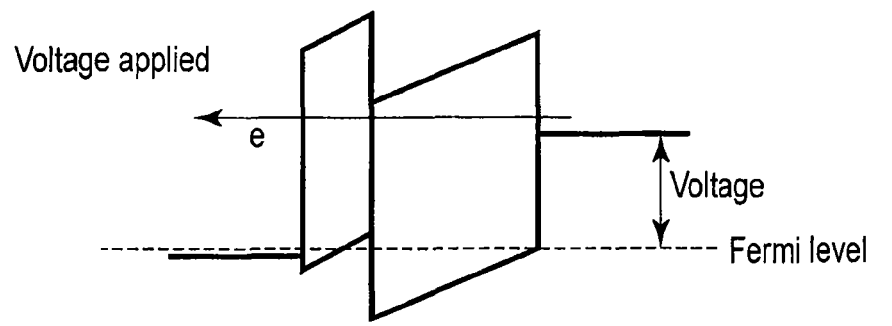
F I G. 5B

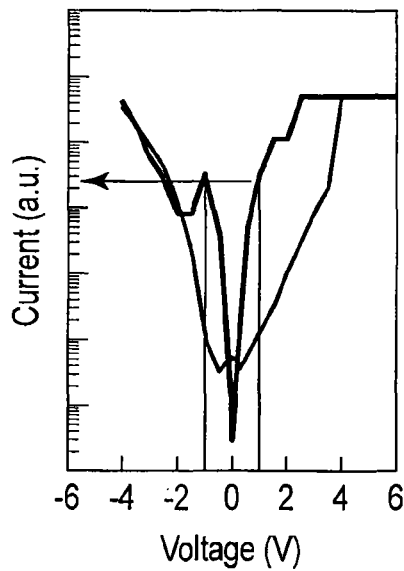
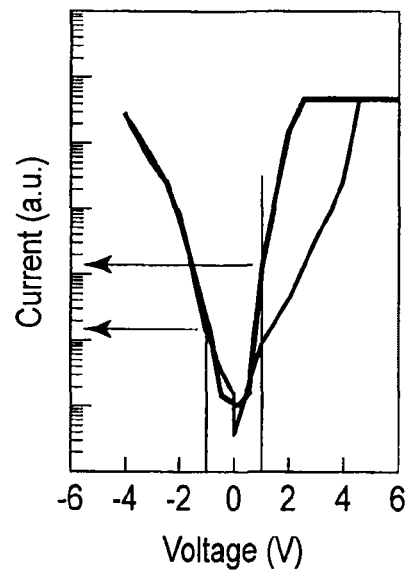
FIG. 6A            FIG. 6B
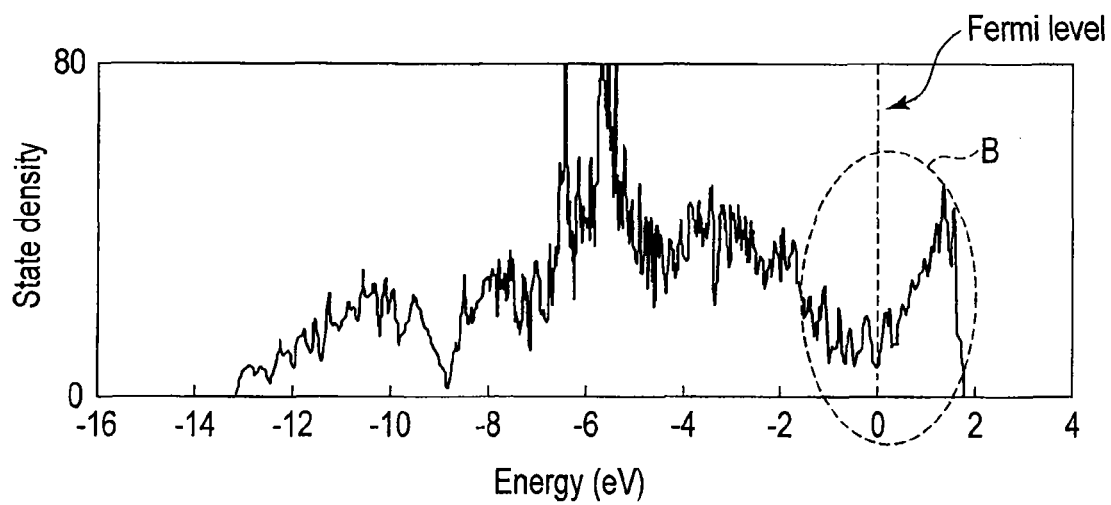
FIG. 7

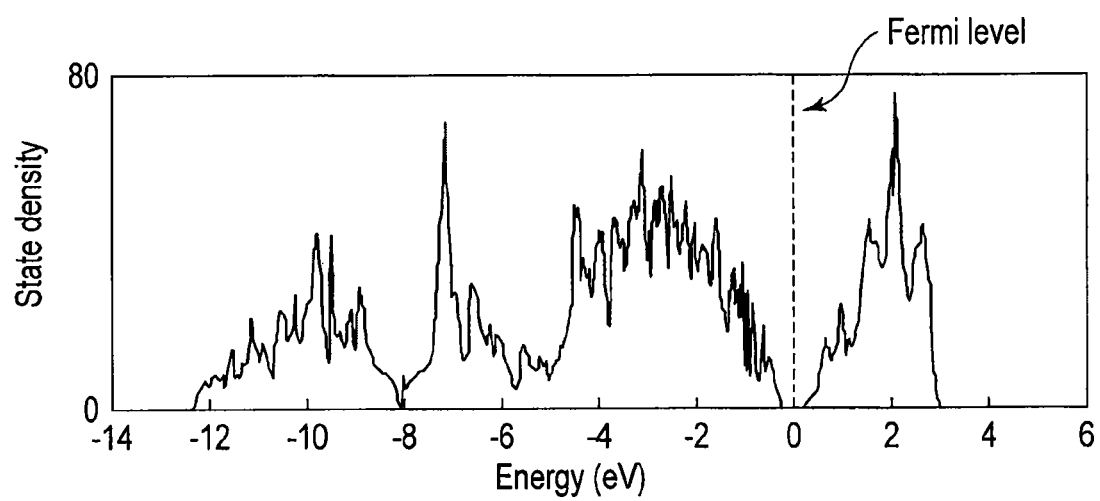
F I G. 8
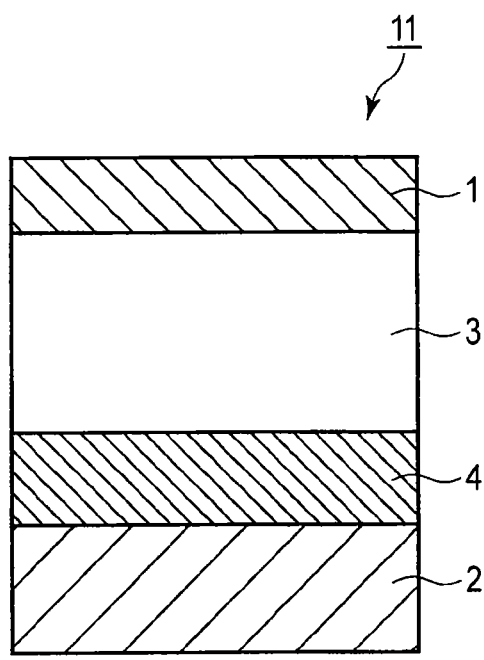
F I G. 9

NONVOLATILE RESISTANCE CHANGE ELEMENT

CROSS REFERENCE TO RELATED APPLICATIONS

This application is a Continuation Application of PCT Application No. PCT/JP2012/058275, filed Mar. 19, 2012 and based upon and claiming the benefit of priority from Japanese Patent Application No. 2011-124541, filed Jun. 2, 2011, the entire contents of all of which are incorporated herein by reference.

FIELD

Embodiments described herein relate generally to a nonvolatile resistance change element with two terminals.

BACKGROUND

In recent years, developments are eagerly made in a nonvolatile resistance change element with two terminals, as represented by a resistive random access memory (Re-RAM). To manufacture a mass storage device by use of nonvolatile resistance change elements with two terminals, a rectifier element needs to be inserted in series with each of individual resistance change elements.

However, if rectifier elements are inserted in series with resistance change elements, each one of memory cells is formed of two elements, i.e., the resistance change element and the rectifier element. Therefore, the height of the memory cells enhances. As a result, the elements are difficult to miniaturize and involves a factor which hinders further enhancement of capacity of the storage device.

A resistance change element which internally has a rectification function may be manufactured in order to suppress processing difficulties from being enhanced by inserting rectifier elements and to provide a mass storage device which operates with excellent reliability. For example, United States Patent Application Publication No. 2009/0014707 (hereinafter referred to as US-2009/0014707) describes an example of a resistance change element as described above.

However, a conventional resistance change element internally having a rectification function exhibits a rectification property with only a low probability, and therefore causes difficulties in achieving a highly reliable mass storage device.

BRIEF DESCRIPTION OF THE DRAWINGS

FIGS. 2 and 3 views showing density of states of a rectification function layer in the resistance change element according to the embodiment;

FIGS. 4A and 4B are cross-sectional views of the resistance change element according to the embodiment and a band diagram thereof when a positive voltage is applied;

FIGS. 5A and 5B are cross-sectional views of the resistance change element according to the embodiment and a band diagram thereof when a negative voltage is applied;

FIGS. 6A and 6B are graphs showing current-voltage characteristics in the embodiment and a conventional resistance change element;

FIG. 7 is a graph showing density of states where binding between metals (Ag) exists in a rectification function layer;

FIG. 8 is a graph showing density of states of the rectification function layer containing Si and Ni according to the embodiment;

FIG. 9 is a cross-sectional view of a resistance change element according to a first embodiment;

DETAILED DESCRIPTION

Hereinafter, a nonvolatile resistance change element according to an embodiment will be described with reference to the drawings. In descriptions below, componential elements which have the same function and configuration as each other will be denoted at a common reference sign, and reiterative descriptions thereof will be made only where needed.

In general, according to one embodiment, a nonvolatile resistance change element includes a first electrode, a second electrode, a semiconductor layer and a first layer. The first electrode includes at least one of Ag, Ni, Co, Al, Zn, Ti, and Cu. The semiconductor layer is sandwiched between the first and second electrodes. The first layer is provided between the second electrode and the semiconductor layer and contains an element included in the semiconductor layer and at least one of Ag, Ni, and Co.

[Basic Concept]

Hereinafter, with reference to FIG. 1, descriptions will be made of a mechanism which performs rectification with excellent reliability with a resistance change element according to the present embodiment.

Figure 1:
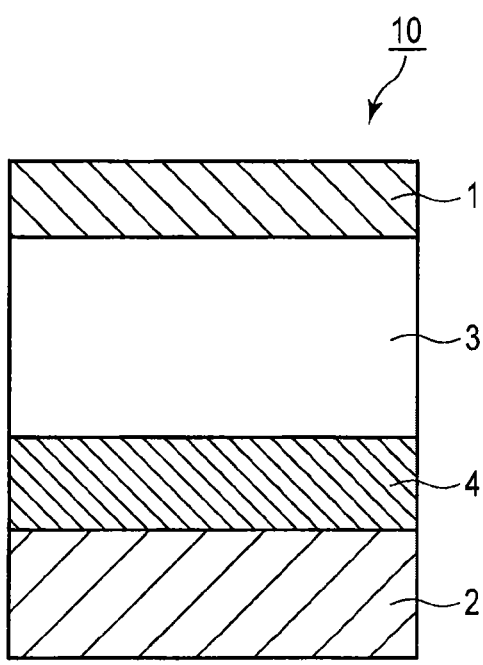
FIG. 1 is a cross-sectional view of a resistance change element according to an embodiment.

FIG. 1 is a cross-sectional view for explaining a basic concept of a resistance change element according to the present embodiment.

As shown in the figure, the resistance change element 10 includes an upper electrode (first electrode) 1, a lower electrode (second electrode) 2, a variable resistance layer 3 provided between the upper electrode 1 and the lower electrode 2, and a rectification function layer (first layer) 4. The rectification function layer 4 is provided between the variable resistance layer 3 and the lower electrode 2. Specifically, the variable resistance layer 3 and the rectification function layer 4 are provided in this order from the side of the upper electrode 1, between the upper electrode 1 and the lower electrode 2.

The lower electrode 2 is formed of, for example, Si (silicon) doped with impurities. The lower electrode 2 is implanted with high concentration boron (B) to achieve 0.005 Ωcm or lower. The upper electrode 1 contains at least one of Ag, Ni, Co, Al, Zn, Ti, and Cu. For example, Ag is used.

The variable resistance layer 3 is formed of a semiconductor layer, e.g., one of amorphous silicon (a-Si), polycrystalline silicon, and monocrystalline silicon. The rectification function layer 4 contains at least one of Ag, Ni, and Co (Ag in this case), and Si as an element forming the variable resistance layer 3. The rectification function layer 4 has a thickness of 1 monolayer or more and 10 nm or less. Rectification caused by the rectification function layer 4 will be clarified by a first principle calculation result.

Figure 2:
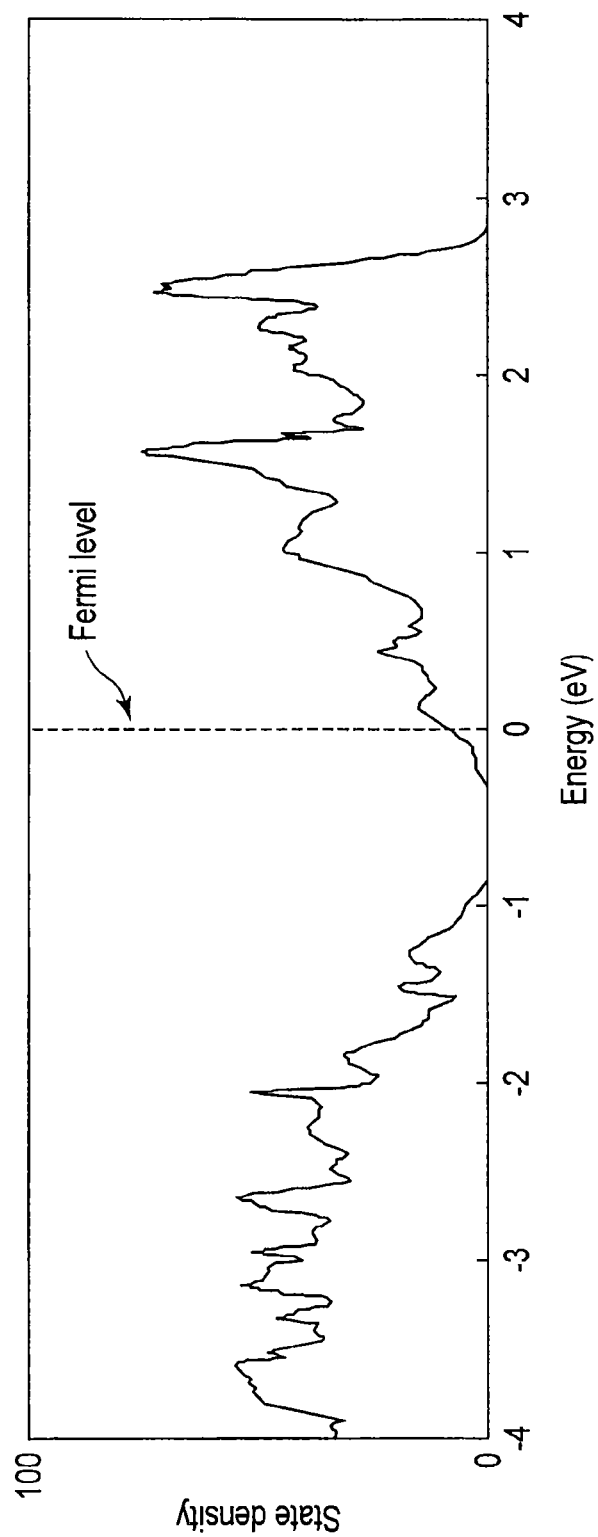

FIGS. 2 and 3 show state densities of the rectification function layer 4. FIG. 2 shows a result of calculating a state of Ag atoms existing in the Si layer or, more specifically, density of states where Ag atoms are in a neutral state in a structure in which the Ag atoms are positioned among Si atoms. A fermi level exists at a low end of a conduction band, and there is no state in a band gap.

FIG. 3 shows density of states of positively charged Ag atoms in the same structure as in FIG. 2, i.e., a state density in an oxidized state ($Ag^+$). Unlike in FIG. 2, a fermi level exists at an upper end of a valence band. Also in this case, there is no energy level in the band gap. Therefore, according to the calculation result, the fermi level can be shifted up and down depending on whether Ag is oxidized or reduced (neutral) without forming a new state in a band gap. Owing to the mechanism as described below, a highly reliable rectification characteristic is considered to be achieved by inserting the rectification function layer 4 formed of a mixture of Ag and Si as described above between the lower electrode 2 and the variable resistance layer 3.

FIG. 4A shows a cross-sectional structure in an on state of the resistance change element according to the present embodiment. FIG. 4B schematically shows a cross-sectional band diagram along A-A' where the upper electrode is positive. The resistance change element shown in FIG. 4A is in a so-called on state (low resistance state) in which a filament 1a containing metal forming the upper electrode 1 is formed on the variable resistance layer 3.

When a positive voltage is applied to the upper electrode 1 of the resistance change element in the on state, electrons are accumulated on the side of the lower electrode 2, and accordingly, the rectification function layer 4 is supplied with electrons. As a result, Ag contained in the rectification function layer 4 is reduced ($Ag^0$), and the fermi level exists on an edge of the conduction band. Therefore, electrons injected from the lower electrode 2 can propagate through the rectification function layer 4 without being obstructed. In other words, a barrier becomes zero when electrons tunnel through the rectification function layer 4.

In contrast, FIG. 5B schematically shows a cross-sectional band diagram along A-A' where a negative voltage is applied to the upper electrode. FIG. 5A shows a cross-sectional structure in the on state as in FIG. 4A.

When a negative voltage is applied to the electrode 1, the lower electrode 2 is relatively applied with a positive voltage to the upper electrode 1. The lower electrode 2 transits into a state in which positive charges or positive holes are accumulated. In this state, Ag contained in the rectification function layer 4 is oxidized ($Ag^+$), and the fermi level exists on an edge of a conduction band, as shown in FIG. 5B. Therefore, when electrons injected from the upper electrode 1 propagate through the rectification function layer 4, the electrons need to move over an electronic barrier equivalent to the band gap of the rectification function layer 4.

From descriptions above, band alignment of the rectification function layer 4 changes depending on the polarity of a voltage applied to the upper electrode 1, and rectification occurs in the resistance change element. That is, the rectification function layer 4 has a function to allow easy flow of a current when a positive voltage is applied to the upper electrode 1, and to hinder flow of a current when a negative voltage is applied thereto. FIGS. 6A and 6B show results thereof. In each of these figures, the vertical axis is logarithmically expressed. If the rectification function layer 4 is not employed (FIG. 6A), inflow of electrons from a metal filament 1a is apparent during application of a negative voltage. However, if the rectification function layer 4 is added (FIG. 6B), inflow of electrons from the metal filament 1a is suppressed. That is, when the rectification function layer 4 is added, a current value can be suppressed to the same extent as in an off state, even in a state in which a metal filament has been formed. As a result, a resistance change element having a highly reliable rectification function can be achieved by adding the rectification function layer 4.

Further as shown in FIG. 7, when a cluster of Ag exists in the rectification function layer 4, a state density caused by bonding between metals appears in a band gap as shown B in FIG. 6B. In this case, a current which undergoes the state density in the band gap is so dominant that effects and operations of the rectification function layer 4 as described above cannot be expected. Accordingly, Ag dispersed in the rectification function layer 4 is more desirable than Ag aggregated as a cluster in the rectification function layer 4.

Further, the rectification function layer 4 may contain either Ni or Co in place of Ag, as described previously. FIG. 8 shows a state density where Ni atoms are neutral in the rectification function layer 4 containing Si and Ni. As shown in FIG. 8, Ni is an element which allows no energy level to exist in a band gap. Furthermore, Co which has similar characteristics to Ni is considered to have a similar state density. Therefore, the metal contained in the rectification function layer 4 is not limited to Ag but may be Ni or Co or may be at least one of Ag, Ni, and Co.

First Embodiment

[1] Structure of Nonvolatile Resistance Change Element

FIG. 9 shows a structure of a nonvolatile resistance change element according to the first embodiment.

As shown in the figure, the resistance change element 11 includes an upper electrode 1, a lower electrode 2, a variable resistance layer 3 provided between the upper electrode 1 and the lower electrode 2, and a rectification function layer 4. The rectification function layer 4 is positioned between the variable resistance layer 3 and the lower electrode 2. That is, the variable resistance layer 3 and the rectification function layer 4 are provided in this order from the side of the upper electrode 1, between the upper electrode 1 and the lower electrode 2.

The lower electrode 2 is formed of, for example, Si doped with impurities. The lower electrode 2 is formed of, for example, Si doped with B at a high concentration, and is set to have a resistance rate of 0.005 Ωcm or lower. The upper electrode 1 includes at least one of Ag, Ni, Co, Al, Zn, Ti, and Cu, and is, for example, formed of Ag.

The variable resistance layer 3 is formed of a semiconductor layer, e.g., one of amorphous silicon, polycrystalline silicon, and monocrystalline silicon. The thickness of the variable resistance layer 3 is, for example, 20 nm or so. The rectification function layer 4 contains at least one of Ag, Ni, and Co (Ag in this case), and Si included in the variable resistance layer 3. The rectification function layer 4 has a thickness of 1 monolayer or more and 10 nm or less.

The lower electrode 2 and the upper electrode 1 are not limited to materials disclosed in the present embodiment. For example, n-type Si doped with as or P may be used for the lower electrode 2, or p-type Si doped with B may be used. Alternatively, a conductive electrode may be used, which is made of metal such as Ti, W, or Ta, carbide thereof, or nitride thereof. Yet alternatively, a conductive material containing a metal material such as Pt, Au, Ir, Ru, Rh, Pd, and Mo may be used for the lower electrode 2.

The upper electrode 1 is not limited to Ag as described previously but may be formed of a conductive material containing at least one of Ag, Ni, Co, Al, Zn, Ti, and Cu. The lower electrode 2 is an electrode as an underlayer for forming the rectification function layer 4 or variable resistance layer 3. The upper electrode 1 is an electrode which is formed after forming the variable resistance layer 3.

Figure 10:
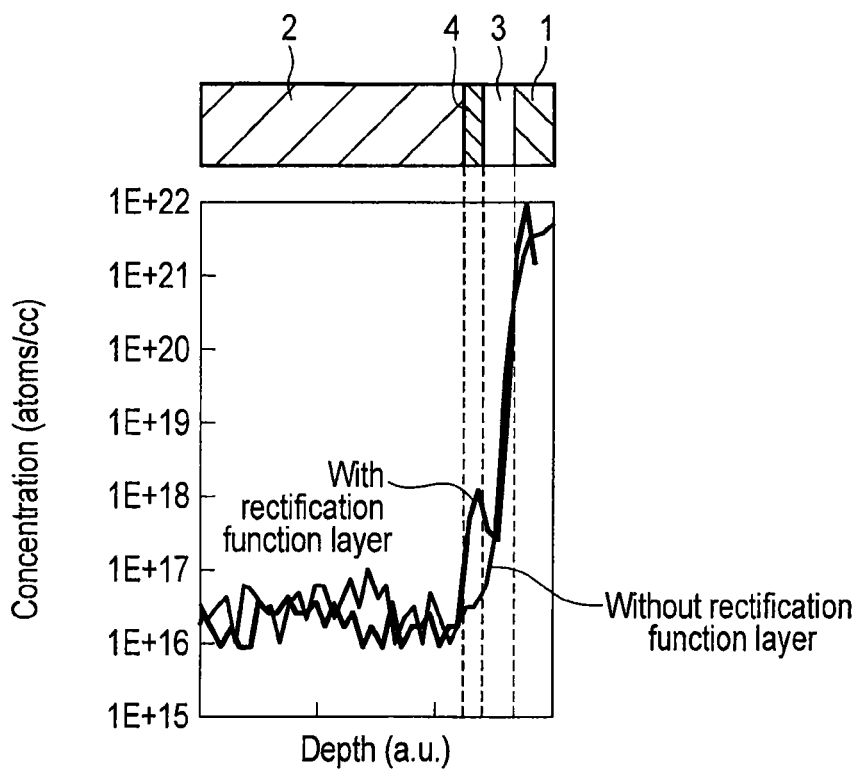
FIG. 10 shows a concentration profile of Ag in the resistance change element according to the first embodiment.

FIG. 10 shows a concentration profile of Ag in the resistance change element 11 according to the first embodiment. For comparison, FIG. 10 shows a concentration profile of Ag in a structure forming no rectification function layer of Ag, i.e., in a layered structure of p+Si/a–Si/Ag.

Concentration distribution of Ag in the resistance change element has a peak between the variable resistance layer 3 and the lower electrode 2. A peak concentration thereof is $1 \times 10^{18}$ atoms/cm$^3$. In other words, the rectification function layer 4 which contains Ag at a concentration of $1 \times 10^{18}$ atoms/cm$^3$ is found to be formed in an interface between the lower electrode 2 and the variable resistance layer 3 in the resistance change element 11. That is, the resistance change element 11 as shown in FIG. 9 according to the first embodiment is formed.

The concentration of Ag contained in the rectification function layer 4 need not always be $1 \times 10^{18}$ atoms/cm$^3$ but typically ranges between $1 \times 10^{17}$ to $1 \times 10^{20}$ atoms/cm$^3$. A lower concentration than this range causes characteristic variability and is therefore not desirable. Otherwise, at a greater concentration than this range, a level caused by binding between metals in the rectification function layer 4 is caused to occur in a band gap, and a satisfactory rectification function cannot be obtained.

[2] Method for Manufacturing Nonvolatile Resistance Change Element

Described next will be a manufacturing method for the nonvolatile resistance change element according to the first embodiment.

The structure of the present embodiment can be formed by, for example, an ion implantation method. A manufacturing method for forming the rectification function layer 4 by the ion implantation method will now be described.

At first, a Si electrode doped with high concentration B is deposited as the lower electrode 2 to be approximately 20 nm thick on a silicon substrate by a CVD method. Subsequently, amorphous silicon is deposited as the variable resistance layer 3 to be approximately 20 nm thick on the lower electrode 2 by the CVD method. The film thickness of each of the lower electrode 2 and the variable resistance layer 3 need not always be 20 nm. Typically, the lower electrode 2 has a film thickness of 10 or more and 200 nm or less, and the variable resistance layer 3 has a film thickness of 3 or more and 100 nm or less.

Next, Ag is injected into an interface between the variable resistance layer 3 and the lower electrode 2 by, for example, an ion implantation method. Thereby, the rectification function layer 4 is formed. Thereafter, Ag as the upper electrode 2 is deposited on the variable resistance layer 3. In the manner as described above, the resistance change element 11 having the structure shown in FIG. 9 is manufactured.

In the manufacturing method as described above, the rectification function layer 4 is formed by injecting Ag into the interface between the lower electrode 2 and the variable resistance layer 3. However, the rectification function layer 4 may be formed by vapor-depositing Ag and performing a thermal treatment.

At first, a Si electrode doped with high concentration B is deposited as the lower electrode 2 to be approximately 20 nm thick on a silicon substrate by the CVD method. Subsequently, amorphous silicon is deposited on the lower electrode 2 by the CVD method. Thereafter, Ag is deposited on the amorphous silicon by a vapor-deposition method. Subsequently, a thermal treatment is performed to diffuse Ag in the amorphous silicon, to thereby form the rectification function layer 4.

Next, Ag on the rectification function layer 4 is removed, and amorphous silicon is thereafter deposited on the rectification function layer 4, to thereby form the variable resistance layer 3. Thereafter, Ag as the upper electrode 1 is deposited on the variable resistance layer 3. In the manner as described above, the resistance change element having the structure shown in FIG. 9 is manufactured.

[3] Effects

FIG. 6B shows a switching characteristic and a rectification characteristic of the resistance change element according to the first embodiment.

As is apparent from the FIG. 6B, there is a great difference in current values between when the upper electrode 1 is applied with a positive voltage and when a negative voltage is applied thereto. Accordingly, occurrence of rectification is found. This difference shows that inflow of electrons from the metal filament formed in the variable resistance layer 3 is suppressed during sweeping of a negative voltage, and rectification is performed instead.

Figure 11:
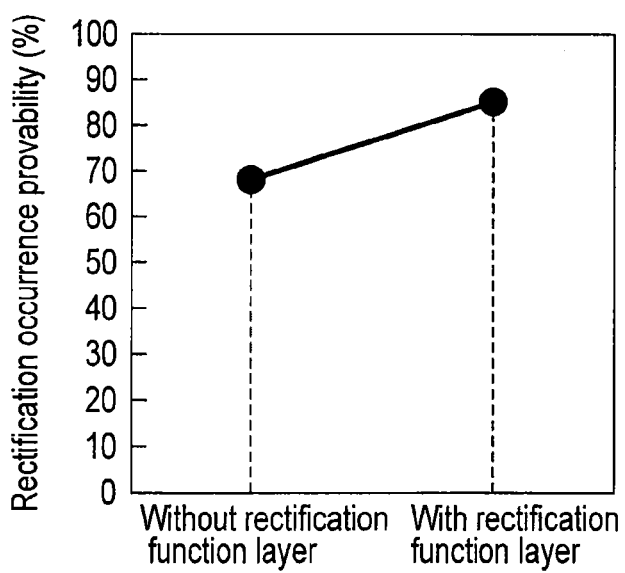
FIG. 11 is a graph showing rectification occurrence probabilities in a structure of the embodiment (with a rectification function layer) and in a p+Si/a-Si/Ag structure (without a rectification function layer)

Further, FIG. 11 shows a result of comparing the structure of the present embodiment (with a rectification function layer) with the p+Si/a–Si/Ag structure (without a rectification function layer).

As a result of eager studies and researches repeatedly challenged by the present inventors, the structure (without a rectification function layer) described in US-2009/0014707 has been found to cause a phenomenon to occur stochastically and to not occur at probability of 100%. Further, a result of the studies by the inventors, the probability of occurrence thereof is at most 70%. The structure described in US-2009/0014707 can therefore not achieve a highly reliable mass storage memory.

In contrast, the structure of the present embodiment remarkably improves in occurrence probability of rectification as shown in FIG. 11, compared with the structure described in US-2009/0014707. In this manner, a nonvolatile resistance change element having a highly reliable rectification function can be achieved. Further, a mass storage memory by use of the nonvolatile resistance change element according to the present embodiment can be provided.

Second Embodiment

A nonvolatile resistance change element according to the second embodiment includes a diffusion barrier layer between a rectification function layer 4 and a variable resistance layer 3.

[1] Structure of Nonvolatile Resistance Change Element

Figure 12:
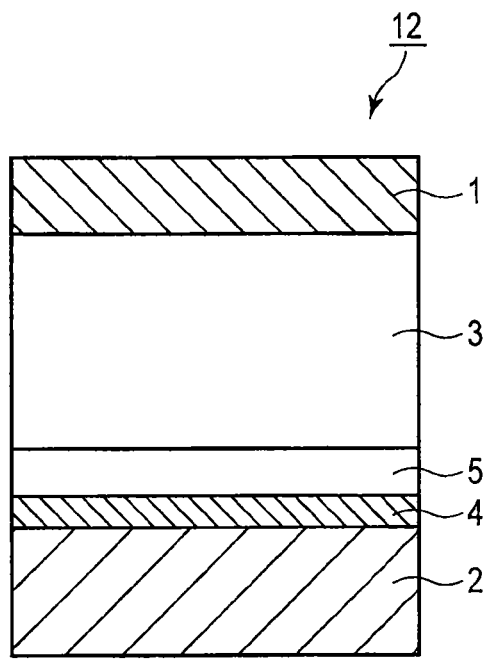
FIG. 12 is a cross-sectional view of a resistance change element according to a second embodiment.

FIG. 12 shows a structure of a nonvolatile resistance change element according to the second embodiment.

As shown in the figure, a resistance change element 12 includes an upper electrode 1, a lower electrode 2, a variable resistance layer 3 provided between the upper electrode 1 and the lower electrode 2, a diffusion barrier layer (second layer) 5, and a rectification function layer 4. The diffusion barrier layer 5 is positioned between the variable resistance layer 3 and the lower electrode 4. That is, the variable resistance layer 3, diffusion barrier layer 5, and rectification function layer 4 are provided in this order from the side of the upper electrode 1, between the upper electrode 1 and the lower electrode 2.

The lower electrode 2 is formed of, for example, TiN. The upper electrode 1 contains at least one of Ag, Ni, Co, Al, Zn, Ti, and Cu. For example, Ag is used. The variable resistance layer 3 is formed of a semiconductor layer, e.g., one of amorphous silicon, polycrystalline silicon, and monocrystalline silicon. The rectification function layer 4 includes at least one of Ag, Ni, and Co (Ag in this case), and Si as an element forming the variable resistance layer 3.

The diffusion barrier layer 5 is formed of, for example, $SiN_x$. The diffusion barrier layer 5 need not always be formed of $SiN_x$ but $SiO_x$, $SiO_xN_y$, oxide of other metal or nitride or carbide may be used. Other features of the configuration of the second embodiment are the same as those of the first embodiment.

[2] Effects

In the second embodiment having the structure as described above, the diffusion barrier layer 5 is formed between the rectification function layer 4 and the variable resistance layer 3. Therefore, Ag can be prevented from being diffused from the rectification function layer 4 into the variable resistance layer 3 due to heat received during formation of a memory device. Accordingly, deterioration of the function as the rectification function layer 4 can be prevented. As a result, variants of characteristics of the rectification function layer 4 can be suppressed for each resistance change element, and a memory device with high operational reliability can be achieved accordingly.

Further, since the diffusion barrier layer 5 is provided, the Ag filament 1a extending from the upper electrode 1 can be prevented from entering into the rectification function layer 4 when a positive voltage is applied to the upper electrode 1. Accordingly, deterioration in rectification function of the rectification function layer 4 can be prevented. Other effects of the configuration of the second embodiment are the same as those of the first embodiment.

Third Embodiment

A nonvolatile resistance change element according to the third embodiment includes a diffusion barrier layer between a lower electrode 2 and a rectification function layer 4.

[1] Structure of Nonvolatile Resistance Change Element

Figure 13:
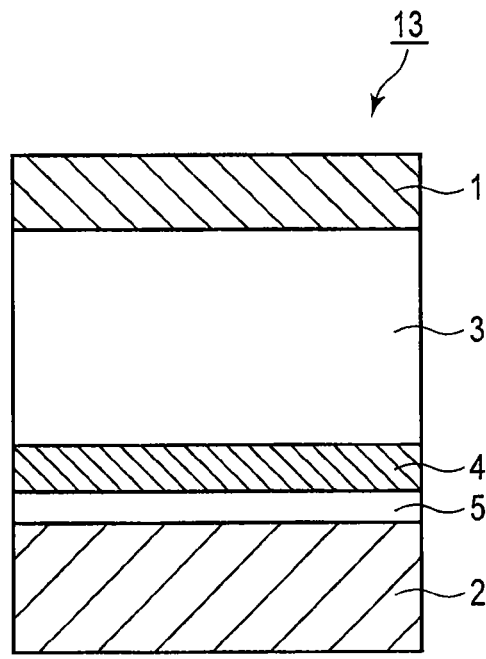
FIG. 13 is a cross-sectional view of a resistance change element according to a third embodiment.

FIG. 13 shows a structure of a nonvolatile resistance change element according to the third embodiment.

As shown in the FIG. 13, the resistance change element 13 includes an upper electrode 1, a lower electrode 2, a variable resistance layer 3 provided between the upper electrode 1 and the lower electrode 2, a rectification function layer 4, and a diffusion barrier layer 5. The diffusion barrier layer 5 is positioned between the lower electrode 2 and the rectification function layer 4. That is, the variable resistance layer 3, rectification function layer 4, and diffusion barrier layer 5 are provided in this order from the side of the upper electrode 1, between the upper electrode 1 and the lower electrode 2.

The lower electrode 2 is formed of, for example, Si doped with B at a high concentration. The upper electrode 1 contains at least one of Ag, Ni, Co, Al, Zn, Ti, and Cu. For example, Ag is used.

The variable resistance layer 3 is formed of a semiconductor layer, e.g., one of amorphous silicon, polycrystalline silicon, and monocrystalline silicon. The rectification function layer 4 contains at least one of Ag, Ni, and Co (Ag in this case), and Si as an element forming the variable resistance layer 3.

The diffusion barrier layer 5 is formed of, for example, $SiN_x$. The diffusion barrier layer 5 need not always be formed of $SiN_x$ but $SiO_x$, $SiO_xN_y$, oxide of other metal or nitride or carbide may be used. Other features of the configuration of the third embodiment are the same as those of the first embodiment.

By configuring the structure as described above, Ag is prevented from being diffused from the rectification function layer 4 into the lower electrode 2 due to heat received during formation of a memory device. As a result, variants of characteristics can be suppressed for each element of the rectification function layer 4, and a memory device with high operational reliability can be achieved accordingly.

[2] Effects

In the third embodiment having the structure as described above, the diffusion barrier layer 5 is formed between the rectification function layer 4 and the lower electrode 2. Therefore, Ag can be prevented from being diffused from the rectification function layer 4 into the lower electrode 2 due to heat received during formation of a memory device. Accordingly, deterioration of the function as the rectification function layer 4 can be prevented. As a result, variants of characteristics of the rectification function layer 4 can be suppressed for each resistance change element, and a memory device with high operational reliability can be achieved accordingly. Other effects of the configuration of the third embodiment are the same as those of the first embodiment.

Example Application

Embodiments have been specifically described above on the basis of specific examples. However, the embodiments are not limited to the foregoing specific examples but any modifications and changes are available without deviating from the scope of the invention. For example, both the diffusion barrier layer 5 described in the second embodiment and the diffusion barrier layer 5 described in the third embodiment can be employed together simultaneously. That is, a variable resistance layer 3, a diffusion barrier layer 5, a rectification function layer 4, and a further diffusion barrier layer 5 may be provided in this order from the side of the upper electrode 1, between the upper electrode 1 and the lower electrode 2.

Further, the present embodiments relate to technology for individuals of memory cells and are applicable to any type of memory devices, independently from a method of connecting the memory cells. For example, the resistance change elements according to the embodiments are applicable to a so-called cross-point-type memory array in which resistance change elements according to any of the embodiments are inserted at crossing parts between upper and lower interconnections, as a storage device which substitutes for a NAND flash memory. Further, the embodiments are applicable to a three-dimensional layering structure of the cross-point type.

Figure 14:
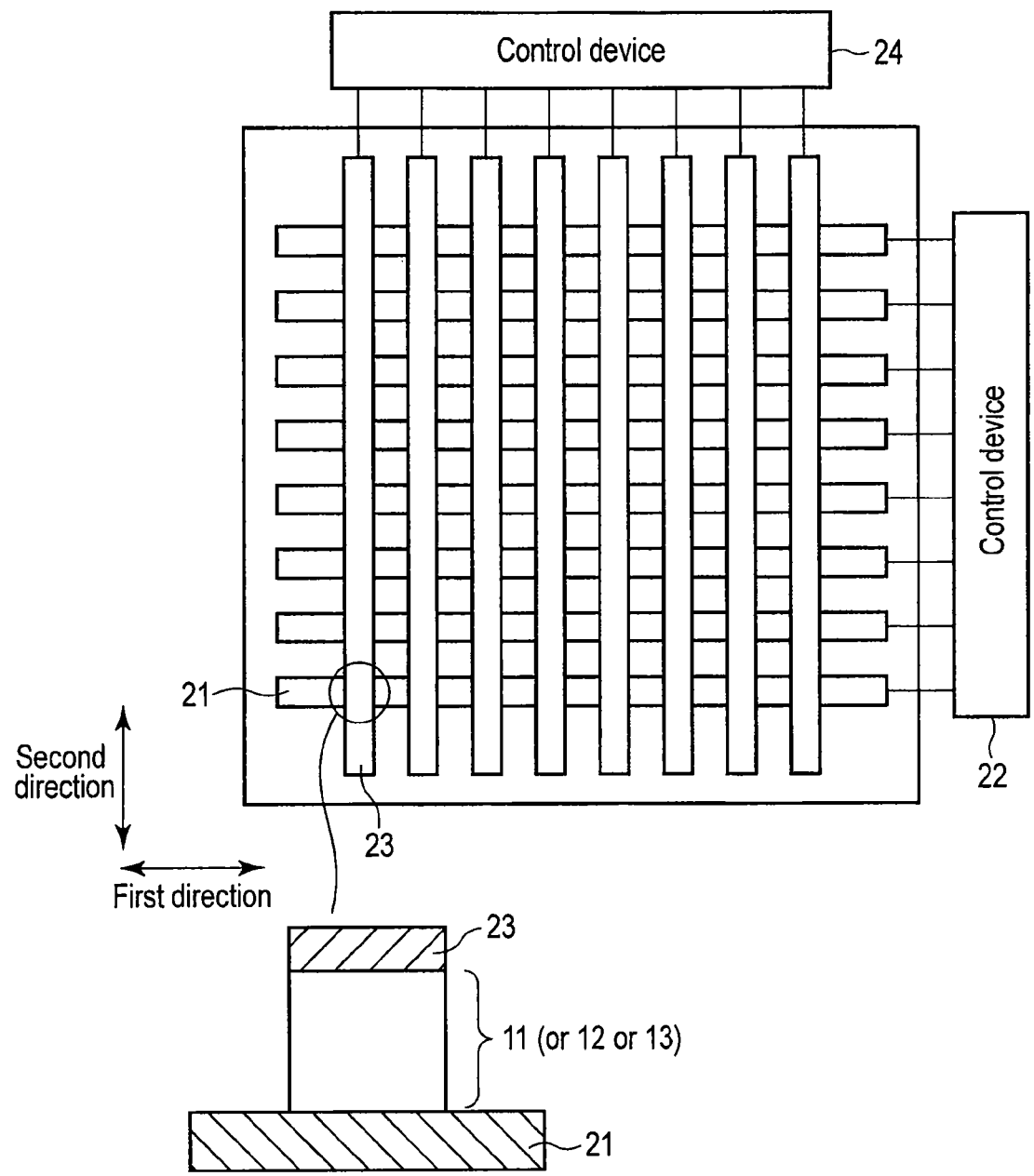
FIG. 14 is a diagram showing an example application to a cross-point-type memory array.

FIG. 14 shows a cross-point type nonvolatile resistance change element. A plurality of lower interconnections 21 extending in a first direction are arrayed in a second direction, and are connected to a control circuit 22 which drives these interconnections. A plurality of upper interconnections 23 extending in the second direction are arrayed in the first direction, and are connected to the control circuit 24 which drives these interconnections. At crossing parts between the lower interconnections 21 and the upper interconnections 23, resistance change elements 11, 12, or 13 are provided.

According to the embodiments as have been described above, there are provided a nonvolatile resistance change element and a nonvolatile resistance change memory with a highly reliable rectification function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile resistance change element, comprising:
   a first electrode comprising at least one of Ag, Ni, Co, Al, Zn, Ti, and Cu;
   a second electrode;
   a semiconductor layer provided between the first and second electrodes; and
   a first layer which is provided between the second electrode and the semiconductor layer and comprises the same element as an element included in the semiconductor layer and at least one of Ag and Co,
   wherein the first layer comes in contact with the second electrode.

2. The nonvolatile resistance change element according to claim 1, further comprising:
   a second layer which is provided between the semiconductor layer and the first layer and comprises one of a silicon oxide film, a silicon oxynitride film, and a silicon nitride film.

3. The nonvolatile resistance change element according to claim 1, wherein the first layer comprises Ag.

4. The nonvolatile resistance change element according to claim 1, wherein the first layer comprises Co.

5. The nonvolatile resistance change element according to claim 1, wherein the second electrode comprises silicon doped with an impurity.

6. The nonvolatile resistance change element according to claim 1, wherein the first layer further comprises Ni.

7. The nonvolatile resistance change element according to claim 1, wherein the at least one of Ag and Co in the first layer has a concentration distribution which has a peak between the semiconductor layer and the second electrode.

8. The nonvolatile resistance change element according to claim 1, wherein the at least one of Ag and Co in the first layer has a concentration between $1\times10^{17}$ and $1\times10^{20}$ atoms/$cm^3$.

9. The nonvolatile resistance change element according to claim 1, wherein the semiconductor layer comprises at least one of amorphous silicon and polycrystalline silicon.

10. The nonvolatile resistance change element according to claim 1, wherein the first layer comprises a rectification.

11. A nonvolatile resistance change element, comprising:
    a first electrode comprising, at least one of Ag, Ni, Co, Al, Zn, Ti, and Cu;
    a second electrode;
    a semiconductor layer provided between the first and second electrodes; and
    a first layer which is provided between the second electrode and the semiconductor layer and comprises the same element as an element included in the semiconductor layer and at least one of Ag and Co,
    wherein the first electrode comprises Ag, and the first layer comprises Ag.

12. A nonvolatile resistance change memory comprising:
    a first interconnection; and
    a second interconnection crossing the first interconnection,
    wherein the nonvolatile resistance change element according to claim 1 is provided at a crossing part between the first and second interconnections.

13. The nonvolatile resistance change element according to claim 11, further comprising:
    a second layer which is provided between the semiconductor layer and the first layer and comprises one of a silicon oxide film, a silicon oxynitride film, and a silicon nitride film.

14. The nonvolatile resistance change element according to claim 11, further comprising:
    a second layer which is provided between the first layer and the second electrode and comprises one of a silicon oxide film, a silicon oxynitride film, and a silicon nitride film.

15. The nonvolatile resistance change element according to claim 11, wherein the second electrode comprises silicon doped with an impurity.

16. The nonvolatile resistance change element according to claim 11, wherein concentration distribution of Ag in the first layer has a peak between the semiconductor layer and the second electrode.

17. The nonvolatile resistance change element according to claim 11, wherein a concentration of Ag in the first layer is $1\times10^{17}$ to $1\times10^{20}$ atoms/$cm^3$.

18. The nonvolatile resistance change element according to claim 11, wherein the semiconductor layer comprises at least one of amorphous silicon and polycrystalline silicon.

19. The nonvolatile resistance change element according to claim 11, wherein a concentration distribution of Ag in the first layer has a peak between the semiconductor layer and the second electrode, and the semiconductor layer comprises at least one of amorphous silicon and polycrystalline silicon.

20. The nonvolatile resistance change element according to claim 11, wherein a concentration of Ag is $1\times10^{17}$ to $1\times10^{20}$ atoms/$cm^3$, and the semiconductor layer comprises at least one of amorphous silicon and polycrystalline silicon.

21. The nonvolatile resistance change element according to claim 11, wherein the first layer comprises a rectification.

22. A nonvolatile resistance change memory comprising:
    a first interconnection; and
    a second interconnection crossing the first interconnection,
    wherein the nonvolatile resistance change element according to claim 11 is provided at a crossing part between the first and second interconnections.

23. A nonvolatile resistance change element, comprising:
    a first electrode comprising at least one of Ag, Ni, Co, Al, Zn, Ti, and Cu;
    a second electrode;
    a semiconductor layer provided between the first and second electrodes; and
    a first layer which is provided between the second electrode and the semiconductor layer and comprises the same element as an element included in the semiconductor layer and at least one of Ag and Co,
    wherein said nonvolatile resistance change element is further characterized by at least one of the following conditions:

a) the first layer comes in contact with the second electrode;
b) the first layer comprises Co;
c) the first layer further comprises Ni;
d) the at least one of Ag and Co in the first layer has a concentration between $1\times10^{17}$ and $1\times10^{20}$ atoms/cm$^3$;
e) first electrode comprises Ag, the first layer comprises Ag, and a concentration distribution of Ag in the first layer has a peak between the semiconductor layer and the second electrode;
f) the first electrode comprises Ag, the first layer comprises Ag, and a concentration of Ag in the first layer is $1\times10^{17}$ to $1\times10^{20}$ atoms/cm$^3$;
g) the first electrode comprises Ag, the first layer comprises Ag, and the semiconductor layer comprises at least one of amorphous silicon and polycrystalline silicon;
h) the first electrode comprises Ag, the first layer comprises Ag, a concentration distribution of Ag in the first layer has a peak between the semiconductor layer and the second electrode, and the semiconductor layer comprises at least one of amorphous silicon and polycrystalline silicon;
i) the first electrode comprises Ag, the first layer comprises Ag, a concentration of Ag is $1\times10^{17}$ to $1\times10^{20}$ atoms/cm$^3$, and the semiconductor layer comprises at least one of amorphous silicon and polycrystalline silicon;
j) the first electrode comprises Ag, and the first layer comprises Ag.

* * * * *